(12) United States Patent
Vaysset et al.

(10) Patent No.: US 9,979,402 B2
(45) Date of Patent: May 22, 2018

(54) SPIN TORQUE MAJORITY GATE DEVICE

(71) Applicants: IMEC VZW, Leuven (BE); Katholieke Universiteit Leuven, Leuven (BE)

(72) Inventors: Adrien Vaysset, Leuven (BE); Iuliana Radu, Heverlee (BE); Geoffrey Pourtois, Villers-la-Ville (BE)

(73) Assignees: IMEC vzw, Leuven (BE); Katholieke Universiteit Leuven, Leuven (BE)

( * ) Notice: Subject to any disclaimer, the term of this patent is extended or adjusted under 35 U.S.C. 154(b) by 0 days. days.

(21) Appl. No.: 15/586,165

(22) Filed: May 3, 2017

(65) Prior Publication Data

US 2017/0302280 A1   Oct. 19, 2017

Related U.S. Application Data

(63) Continuation of application No. PCT/EP2015/075552, filed on Nov. 3, 2015.

(30) Foreign Application Priority Data

Nov. 3, 2014 (EP) ..................... 14191541
Nov. 7, 2014 (EP) ..................... 14192272

(51) Int. Cl.
*H03K 19/23* (2006.01)
*H03K 19/18* (2006.01)
*H01L 43/08* (2006.01)

(52) U.S. Cl.
CPC ............ *H03K 19/23* (2013.01); *H01L 43/08* (2013.01); *H03K 19/18* (2013.01)

(58) Field of Classification Search
None
See application file for complete search history.

(56) References Cited

U.S. PATENT DOCUMENTS 8,198,919 B1 *  6/2012 Kozhanov ......... H01F 10/3254
                                                                326/104
8,450,818 B2    5/2013 Nikonov et al.
(Continued)

OTHER PUBLICATIONS

Bourianoff, G. et al., "Progress, Opportunities and Challenges for Beyond CMOS Information Processing Technologies," ECS Transactions, vol. 35 No. 2, pp. 43-53; 2011.
(Continued)

*Primary Examiner* — Jany Richardson
(74) *Attorney, Agent, or Firm* — Knobbe, Martens, Olson & Bear LLP

(57) ABSTRACT

The disclosed technology generally relates to magnetic devices and more particularly to spin torque majority gate devices, and to methods of operating such devices. In one aspect, a majority gate device comprises a free ferromagnetic layer comprising 3N input zones and an output zone. The output zone has a polygon shape having 3N sides, where each input zone adjoins the output zone. The input zones are arranged around the output zone according to a 3N-fold rotational symmetry, where N is a positive integer greater than 0. The input zones are spaced apart from one another by the output zone. The majority gate device additionally comprises a plurality of input controls, where each of the input zones is magnetically coupled to a corresponding one of the plurality of input controls, where each of the input controls is configured to control the magnetization state of the corresponding input zone. The majority gate device further comprises an output sensor magnetically coupled to the output zone, where the output sensor is adapted for sensing the magnetization state of the output zone. Each input zones adjoins the output zone at one of the 3N sides.

15 Claims, 13 Drawing Sheets

(56) References Cited

U.S. PATENT DOCUMENTS

2011/0148458 A1* 6/2011 Sugibayashi ........... H01L 43/08
　　　　　　　　　　　　　　　　　　　　　　326/37
2012/0038387 A1　2/2012 Nikonov et al.

OTHER PUBLICATIONS

International Search Report and Written Opinion dated Feb. 15, 2016 in International Patent Application No. PCT/EP2015/075552; 13 pages.
Nikonov, DE et al., "Proposal of a Spin Torque Majority Gate Logic," IEEE Electron Device Letters, vol. 32 No. 8, pp. 1128-1130; 2011.

* cited by examiner

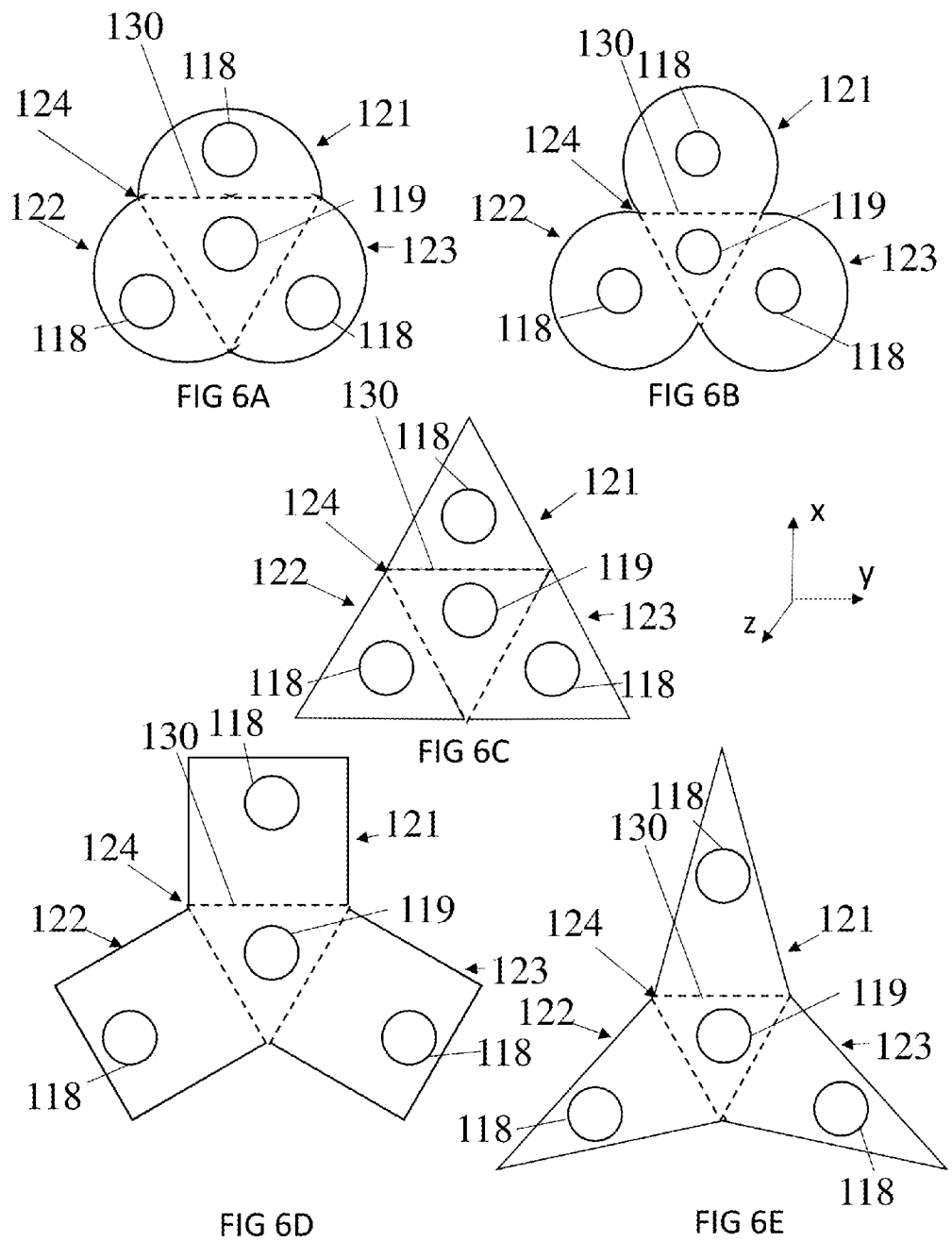

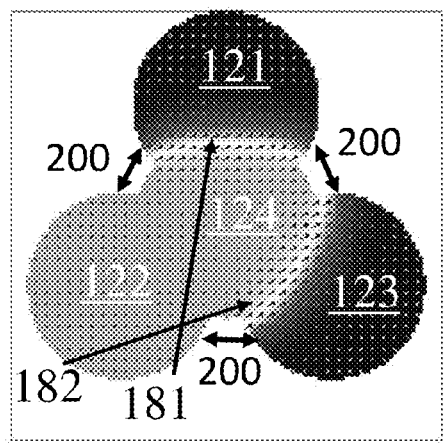
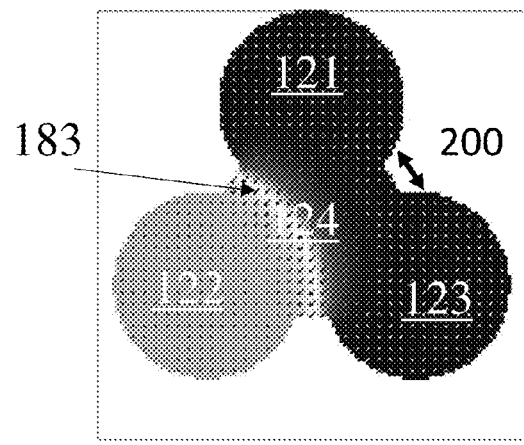
FIG 8A                FIG 8B
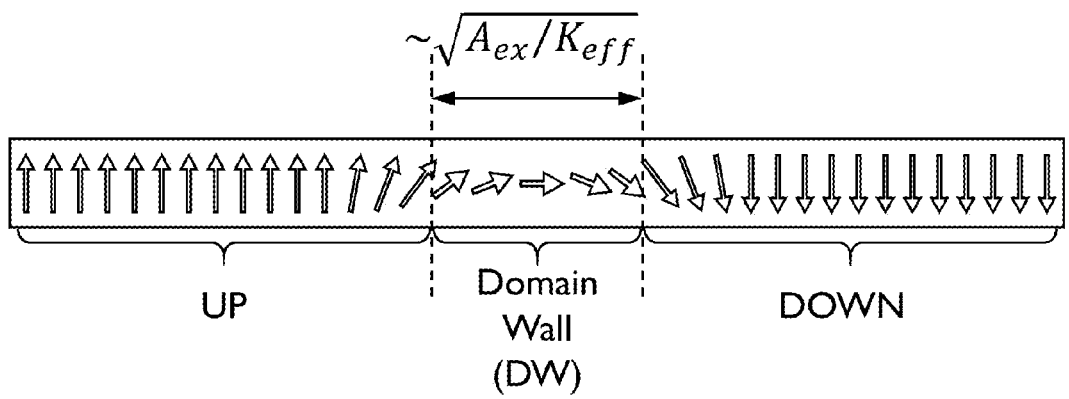
FIG 9

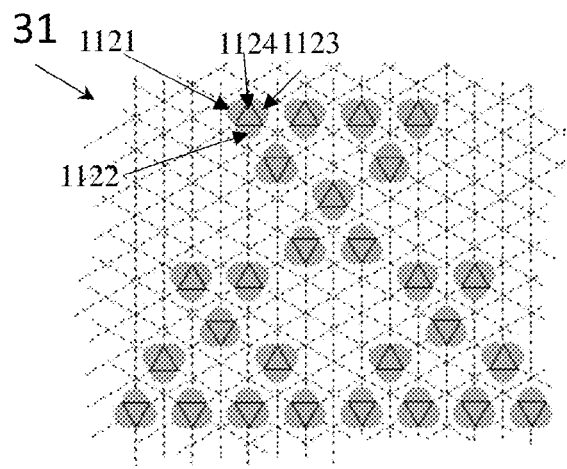
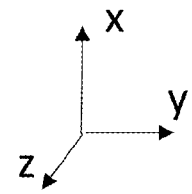
FIG 12A
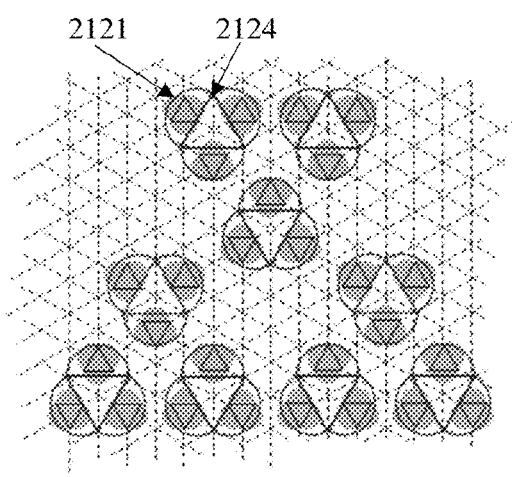
FIG 12B
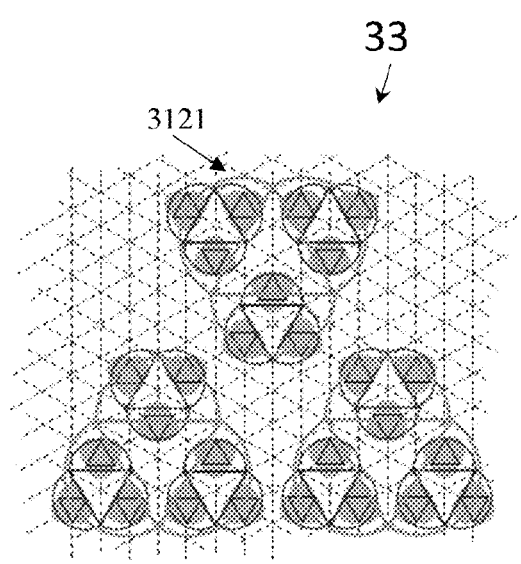
FIG 12C
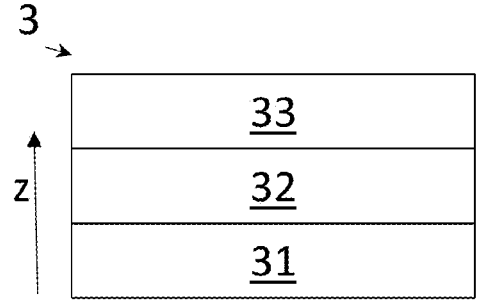
FIG 12D

SPIN TORQUE MAJORITY GATE DEVICE

CROSS-REFERENCE TO RELATED APPLICATIONS

This application is a continuation of PCT Application No. PCT/EP2015/075552, filed on Nov. 3, 2015, which claims priority to European Patent Application No. EP 14191541.3, filed on Nov. 3, 2014, and to European Patent Application No. EP 14192272.4, filed on Nov. 7, 2014. Each of the above applications is incorporated herein by reference in its entirety.

BACKGROUND

Field

The disclosed technology generally relates to magnetic devices and more particularly to spin torque majority gate devices, and to methods of operating such devices.

Description of the Related Technology

As the complementary metal-oxide-semiconductor (CMOS) integrated circuit device technology continues to scale to smaller technology nodes, the density of transistors per unit area in CMOS integrated circuit devices correspondingly continues to increase. In addition, as the density of transistors per unit area in the CMOS integrated circuit devices increases, the power consumed per unit area, or the power density, continues to increase in turn. Various approaches have been proposed to address the increasing power density with scaling, including approaches where at least some of the CMOS transistors are replaced with magnetic devices. One approach to address the increasing power density, as described in the present disclosure is spintronics, where a signal, e.g., current, associated with magnetization is used for computing instead of a signal associated with electric charge, as in traditional CMOS-based logic devices. Using properties of spintronics, a type of device called "majority gate" can be advantageously built.

In an article of Nikonov et al. entitled "Proposal of a Spin Torque Majority Gate Logic" as published in IEEE Electron Device Letters 32 (8) in August 2011, a possible layout is disclosed of a spin majority gate device with perpendicular magnetization. As described herein, a perpendicular magnetization refers to a device configuration in which the direction of magnetization is perpendicular to the plane of a major surface of a magnetic layer, e.g., a free (switchable) ferromagnetic layer. The layout is schematically shown in FIG. 1 in top plan view and in FIG. 2 in side view. This spin torque majority gate 1 consists of a common free (switchable) ferromagnetic (FM) layer 202 and thereon four independent fixed FM layers 2181, 2182, 2183, 2191 in each of the nanopillars 218, 219—three for the inputs 218 and one for the output 219. The free FM layer 202 and fixed FM layers 2181, 2182, 2183, 2191 are separated by a non-magnetic spacer layer 204. The operation of the device is based on spin transfer torque. The device operates by applying a positive or negative voltage to each input nanopillar 218, which thereby determines the directions of current flowing through each nanopillar 218 and the resulting spin torques. The free FM layer 202 can be in one of the two stable states of magnetization, e.g. as illustrated by the arrow 2021, being 'up' in FIG. 2, which can be used to represent logical "0" and "1" states. Spin torques of the input nanopillars act on the FM layer 202 to retain the gate in its original state or to switch it to the opposite state, depending on their direction, e.g. as illustrated by the arrows directed 'up' for 2181 and 2182 and 'down' for 2183. Devices such as the illustrated device, in which the majority of the torques determines the resulting outcome state of magnetization, are referred to herein as a spin torque majority gate (STMG) devices. The state of magnetization is detected by magnetoresistance (MR) between the free 202 and the fixed layer 2191 by the output pillar 219.

Various layouts have been proposed by Nikonov et al. such as, for example, a circular layout as illustrated in U.S. Pat. No. 8,450,818. By using a circular free ferromagnetic layer 102 and circular input contacts 218 arranged around an output contact 219, high gradients of magnetization in the corners may be avoided, as illustrated in FIG. 3.

It is an advantage of some spin torque majority gate (STMG) devices that, in principle, an operation can be realized by a simple and efficient construction, which could otherwise include as many as nineteen or more transistors in a conventional CMOS circuit. Spin-based logic/spintronics could potentially reduce power consumption, while also being more compact than conventional CMOS circuits. Additionally, part of the logic circuit may be advantageously relocated to the interconnect level and may allow stacking e.g., vertically stacking in a direction normal to a major surface of the substrate, thus potentially even further reducing the footprint. A spin torque majority gate device allows reducing the complexity at the circuit level by bringing it at the device level in a compact form.

However, a further need still exists for alternative layouts with improved reliability and optimization with respect to majority gate devices known in the art.

SUMMARY OF CERTAIN INVENTIVE ASPECTS

It is an object of embodiments of the disclosed technology to provide good, efficient and/or reliable majority gate devices and methods for operating such devices.

The above objective is accomplished by a majority gate device and method for operating a majority gate device according to embodiments of the disclosed technology.

In a first aspect, the disclosed technology relates to a majority gate device that comprises a free ferromagnetic layer comprising 3N input zones and an output zone. The shape of the output zone is a polygon that has 3N sides, e.g. the number of sides of the polygon shape is equal to 3N. For example, the free ferromagnetic layer comprises 3N input zones and one polygon output zone having 3N sides. For example, the output zone may have the shape of a regular polygon. Each input zone adjoins the output zone at a corresponding side of said polygon. The input zones are furthermore positioned around, e.g., to laterally surround, the output zone according to a 3N-fold rotational symmetry. Each input zone is thus adjoining the output zone at one of its 3N sides, e.g. at one and only one of its 3N sides. N is a strictly positive finite integer, i.e. an integer larger than 0. The input zones are spaced apart from one another by the output zone. The majority gate device comprises the plurality of input controls, wherein each input control is magnetically coupled to a corresponding input zone, e.g. each input zone is magnetically coupled to a corresponding input control. Each input control is further adapted for controlling the magnetization state of corresponding input zone, e.g. for controlling the magnetization state of the free ferromagnetic layer via the corresponding input zone, e.g. for influencing the magnetization state of the free ferromagnetic layer by locally controlling the magnetization state of the corresponding input zone. The majority gate device also comprises an output sensor magnetically coupled to the output zone, the output sensor being adapted for sensing the magnetization state of the output zone.

In a majority gate device according to embodiments of the disclosed technology, N may be selected, e.g., from 1, 2, 3 or 4. A majority gate with a 3-fold rotational symmetry may thus comprise a triangle output having 3 sides and 3 input zones arranged around and in contact with the output zone. A majority gate with a 6-fold rotational symmetry will thus comprise a hexagon output having 6 sides and 6 input zones arranged around and in contact with the output zone.

In embodiments of the disclosed technology, a 3-fold rotational symmetry may be advantageous.

In a majority gate device according to embodiments of the disclosed technology, the input zones may be substantially spaced apart from one another. This means an input zone may intersect with another input zone at one point. This intersecting point may also be an intersection point with the output zone. The input zone may also be spaced apart from another input zone by a certain distance. The distance spacing apart two neighboring input zones may preferably be smaller than the width of the domain wall (between the input zones and the output zones).

In a majority gate device according to embodiments of the disclosed technology, the output zone and each input zone may correspond to a magnetic domain of the free ferromagnetic material, each magnetic domain having a single or uniform magnetization state, e.g. in equilibrium, e.g. without external disruptive influences and after stabilization of transient effects. Each input zone may thus correspond to a single magnetic domain with a uniform magnetization state. The output zone may thus correspond to a single magnetic domain with a uniform magnetization state.

In a majority gate device according to embodiments of the disclosed technology, the magnetization of the free ferromagnetic layer may be out-of-plane.

In a majority gate device according to embodiments of the disclosed technology, each input control may be magnetically coupled to the corresponding input zone by a magnetic tunnel junction (MTJ).

In a majority gate device according to embodiments of the disclosed technology, the output sensor may be magnetically coupled to the corresponding output zone by a magnetic tunnel junction (MTJ).

In a majority gate device according to embodiments of the disclosed technology, the MTJ may be formed by a stack comprising a non-magnetic insulating layer present in between the free ferromagnetic layer and a fixed ferromagnetic layer. The input control and/or output sensor may comprise the non-magnetic insulating layer and the fixed ferromagnetic layer. In an alternative embodiment the non-magnetic insulating layer may also be present over the entire surface of the free ferromagnetic layer, not being part of the input control and/or output sensor.

In a majority gate device according to embodiments of the disclosed technology, each input control may be magnetically coupled to the corresponding input zone by spin Hall effect.

In a majority gate device according to embodiments of the disclosed technology, a distance between each input control and the output sensor, e.g., the shortest distance between each input control and the output sensor, may be preferably smaller than 400 nm, more preferably smaller than 200 nm.

In a majority gate device according to embodiments of the disclosed technology, the input control and/or the output sensor may be circular pillars.

In a majority gate device according to embodiments of the disclosed technology, each input zone may be subdivided in neighboring input subzones, the corresponding input control of the input zone being magnetically coupled to one of the input subzones. The majority gate device may further comprise, for each remaining input subzone, another corresponding input control, the another input control being magnetically coupled to its corresponding input subzone. The input controls of each input zone may be electrically connected.

In a majority gate device according to embodiments of the disclosed technology, the input zone may have a shape chosen from an isosceles trapezoid, a rectangle, a square, a triangle, a segment or a semicircle. The segment may be a major segment of a circle or a minor segment of a circle.

In a majority gate device according to embodiments of the disclosed technology, the width of the input zone may decrease towards the output zone.

Embodiments of the disclosed technology may also relate to a three dimensional majority gate device, the three dimensional majority gate device comprising a second layer of majority gate devices according to embodiments of the disclosed technology, the second layer being stacked on a first layer of majority gate devices according to embodiments of the disclosed technology. The output zone of a majority gate device of the first layer may be coupled to an input zone of a majority gate device of the second layer.

In another aspect, the disclosed technology also relates to a method for operating a majority gate. The method comprises the steps of applying a predetermined voltage to each input control for providing the magnetization state of the output zone; and thereafter, determining the combined effect of the predetermined voltages on the current of the output sensor which is determined by the magnetization state of the output zone.

In a method according to embodiments of the disclosed technology, the magnetization state of the output zone may equal the majority magnetization state of the input zones.

In a method according to embodiments of the disclosed technology, the combined effect of the predetermined voltages may induce the adjoining of at least two domain walls and the propagation of the adjoined domain walls entirely through the output zone.

In a method according to embodiments of the disclosed technology, the magnetization state of the input zones and/or the output sensor may be controlled and or sensed by in-plane current, spin Hall effect, giant spin Hall effect, Rashba torque, spin-orbit torque, magnetic field generated by a current, magnetic field generated by additional ferromagnetic layers (stray field) or voltage-controlled anisotropy (electric field).

It is an advantage of embodiments of the disclosed technology that a majority gate device can be scaled to a smaller size than a majority gate that is realized with CMOS transistors.

It is an advantage of embodiments of the disclosed technology that a majority gate device is provided that is compatible with current CMOS manufacturing technologies and current etching techniques to pattern the proposed layouts.

It is an advantage of embodiments of the disclosed technology that a majority gate device is provided that is very scalable.

It is an advantage of embodiments of the disclosed technology that a majority gate device is provided that works for large effective anisotropy, e.g. that it has large thermal stability. Therefore, the retention time can be large; and a logic device that is non-volatile can be made. This means it does not suffer from standby power dissipation.

It is an advantage of embodiments of the disclosed technology that a majority gate device is provided that has a reliable switching behavior independent of the input combination.

It is an advantage of embodiments of the disclosed technology that a majority gate device is provided that is compatible with current lithography processing, wherein the critical dimension can be large while maintaining compactness of the device. This means the manufacturing of the majority gate device according to embodiments is not dependent on very advanced lithography processes (such as for example extreme ultraviolet lithography).

It is an advantage of embodiments of the disclosed technology that very compact logic circuits may be build. These logic devices can be fabricated in the metal layers (back-end of line/interconnect) and can be combined with logic layer in the front-end (i.e. at transistor level). This has the advantage of allowing for three dimensional stacking of devices.

BRIEF DESCRIPTION OF THE DRAWINGS

All drawings are intended to illustrate some aspects and embodiments of the present disclosure. The drawings described are only schematic and are non-limiting.

FIGS. 6A-6E show schematic top-down views of different layouts of STMG devices according to various embodiments of the disclosed technology. FIG. 6A and FIG. 6B are referred to herein as 'circle segment' layouts; FIG. 6C and FIG. 6E are referred to herein as 'triangle' layouts; FIG. 6D is referred to herein as a 'square' layout.

FIGS. 8A and 8B show results of simulations performed for a STMG device having a 'circle segment' layout, according to embodiments of the disclosed technology.

FIG. 9 illustrates a schematic representation of magnetic domains and a domain wall for illustrating working principles of embodiments of the disclosed technology.

FIGS. 12A-12D illustrate a three-dimensional stacked STMG device according to embodiments of the disclosed technology. FIGS. 12A-12C show schematic top views of three layers, respectively, in the three-dimensional stacked STMG device. FIG. 12D illustrates a schematic side view of the three-dimensional stacked STMG device.

DETAILED DESCRIPTION OF CERTAIN ILLUSTRATIVE EMBODIMENTS

Figure 1:
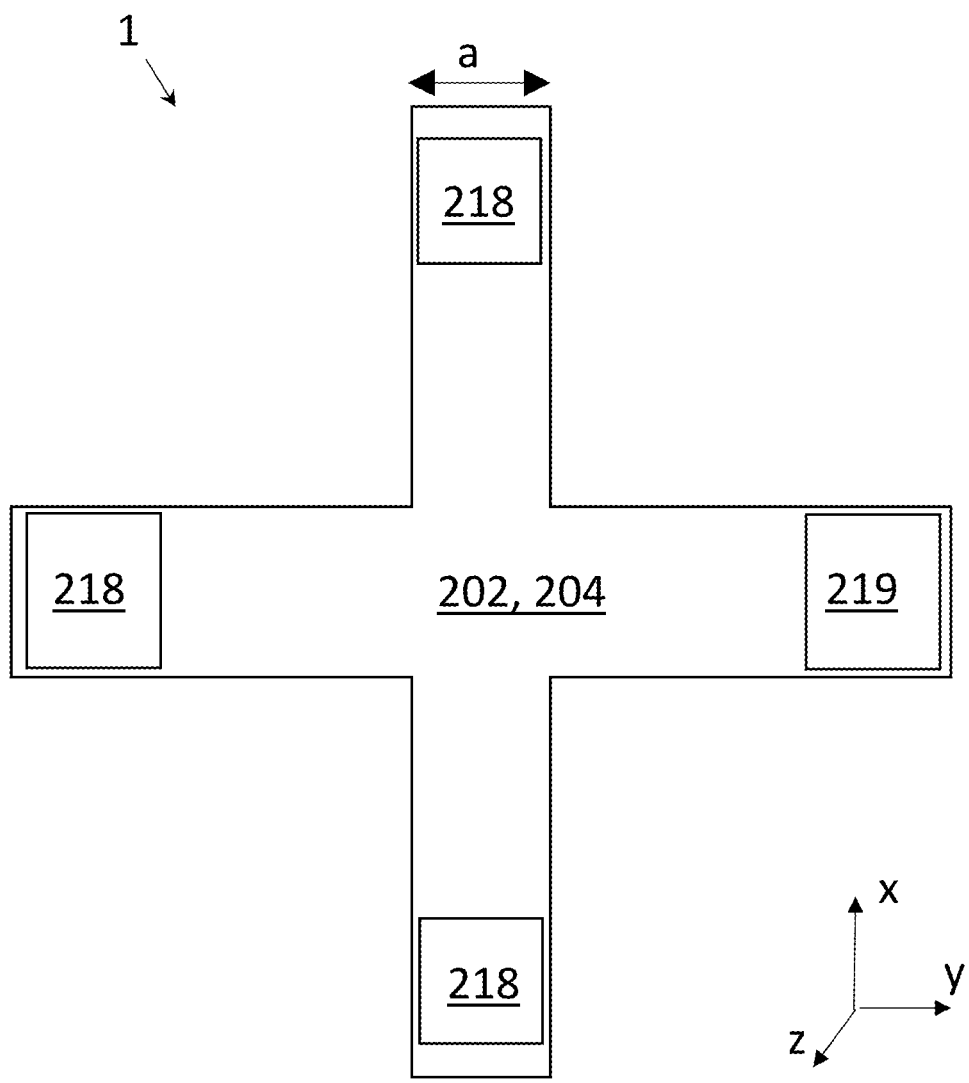
FIG. 1 shows a schematic top-down view of a spin torque majority gate (SMTG) device having a crossbar arrangement.

The present disclosure will be described with respect to particular embodiments and with reference to certain drawings but the disclosure is not limited thereto. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second and the like in the description, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, under and the like in the description are used for descriptive purposes and not necessarily for describing relative positions. It is to be understood that the terms so used are interchangeable under appropriate circumstances and that the embodiments of the disclosure described herein are capable of operation in other orientations than described or illustrated herein. Nevertheless, when reference is made in conjunction to upward, downward, up, down, above, below, and other such terms, it should be interpreted as referring to orientations with respect to a common reference direction, insofar magnetic and/or electric field properties of the features thus described are substantially determined by such relative orientations when considered together.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

As used herein, a '+' sign in the figures or in the description, for a ferromagnetic layer having a downwards magnetization, may indicate a configuration in which a positive voltage is applied, e.g. a configuration in which a higher voltage may be applied from above a layer with respect to a reference voltage applied below the layer, resulting in an upwards magnetization. Equivalently, a + sign may refer to a spin torque 'UP' configuration. Analogously, as used herein, a '−' in the figures or in the description, for a ferromagnetic layer having a downwards magnetization, may indicate a configuration in which a negative voltage is applied, e.g. a configuration in which a lower voltage may be applied from above a layer with respect to a reference voltage applied below the layer, resulting in a downwards magnetization. Equivalently, a − sign may refer to a spin torque 'DOWN' configuration. It is clear for a person skilled in the art that opposite signs may be used to describe a reference ferromagnetic layer having an upwards magnetization. In this case, applying a positive voltage ('+') results in a downwards magnetization, or a spin torque 'DOWN,' while applying a negative voltage ('−') results in an upwards magnetization, or a spin torque 'UP'.

Generally speaking, an object with rotational symmetry, also known as radial symmetry, is an object that looks the same after a certain amount of rotation. Depending on how many degrees the shape has to be turned to look the same on a different side or vertex, the shape has an n-fold rotation symmetry. As described herein, an N-fold rotational symmetry, also referred to as a rotational symmetry of order N or discrete rotational symmetry of the Nth order, with respect to a particular point (in two dimensions) or axis (in three dimensions), describes a configuration in which a rotation by an angle of 360°/N (180° for N=2, 120° for N=3, 90° for N=4, 72° for N=5, 60° for N=6, 51 3/7° for N=7, etc.) effectively does not change the object. For example, a 3-fold rotational symmetry means that the shape remains the same by rotation of 120°. The input zones being positioned relative to each other with respect to the output zone according to a 3N-fold rotational symmetry thus means that by rotating the input zones with 120°/N the shape remains unchanged, with N being an integer larger than 0. Particularly, each input zone may bijectively map onto another input zone by application of such rotation over 120°/N.

As described herein, an object having a rotational symmetry with respect to any angle is referred to as having a circular symmetry. An object having a 3N-fold rotational symmetry excludes a circular symmetry. N can thus not be infinite.

Whenever referred throughout the disclosure to 'domain wall' or 'DW', the following is meant. A 'domain wall' or 'DW' is an interface separating magnetic domains, as illustrated in FIG. 9. It is a transition between different magnetic moments, and usually undergoes an angular displacement of 90° or 180° of magnetization moment orientation. A 'domain wall' or 'DW' is a gradual reorientation of individual moments across a finite distance. The domain wall width depends on the exchange $A_{ex}$ and the effective anisotropy $K_{eff}$ of the material $$\left(\sim\sqrt{\frac{A_{ex}}{K_{eff}}}\right),$$

which may be about 10 to 50 nm in some configurations.

As described herein, a magnetization direction that is 'out-of-plane' refers to a configuration in which the magnetization of magnetic domains are pointing either 'UP' or 'DOWN', i.e. are directed substantially out of the (surface) plane of the ferromagnetic layer but, of course, the domain walls are in-plane, i.e. in the plane of the (surface) plane. For the ease of understanding a three dimensional Cartesian coordinate system may be used with (x,y) defining the surface plane (of the free ferromagnetic layer) and the z-axis defining the 'UP' or 'DOWN' magnetization state.

Figure 2:
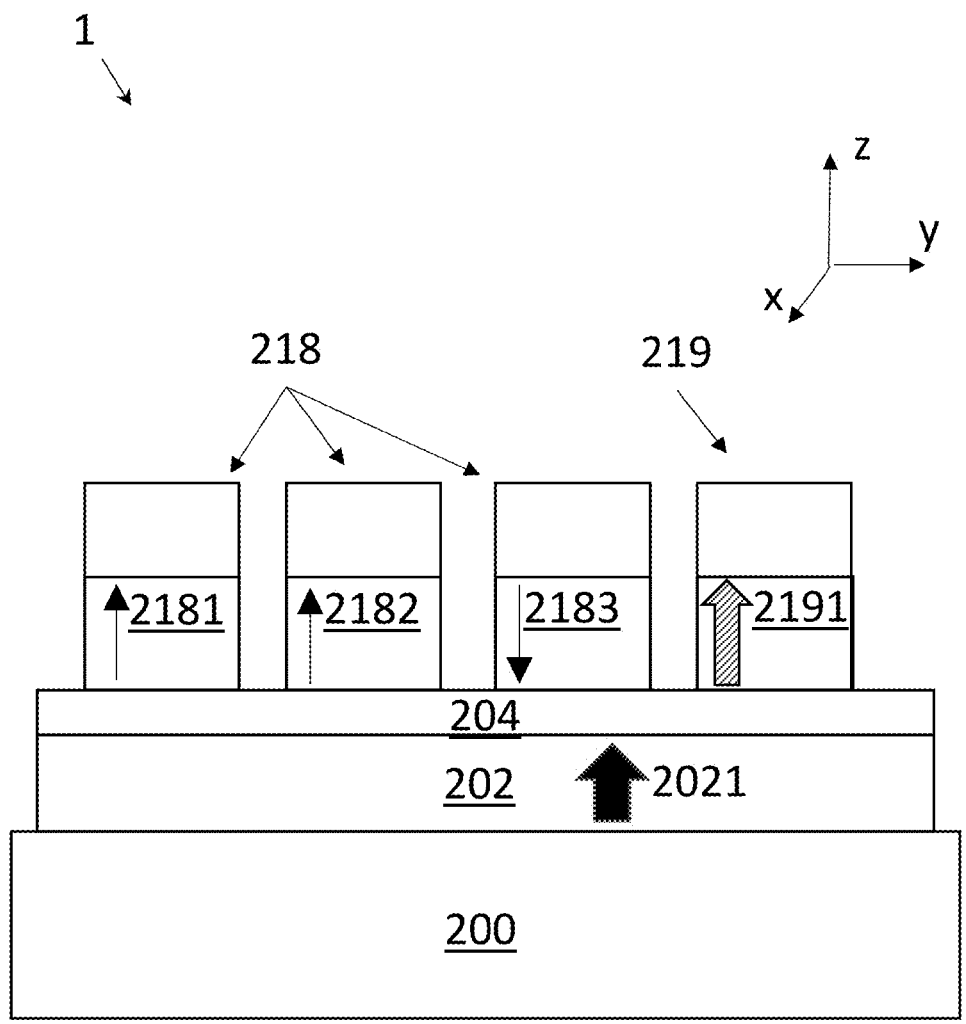
FIG. 2 shows a cross-sectional or a side view of the STMG device illustrated in FIG. 1.
Figure 3:
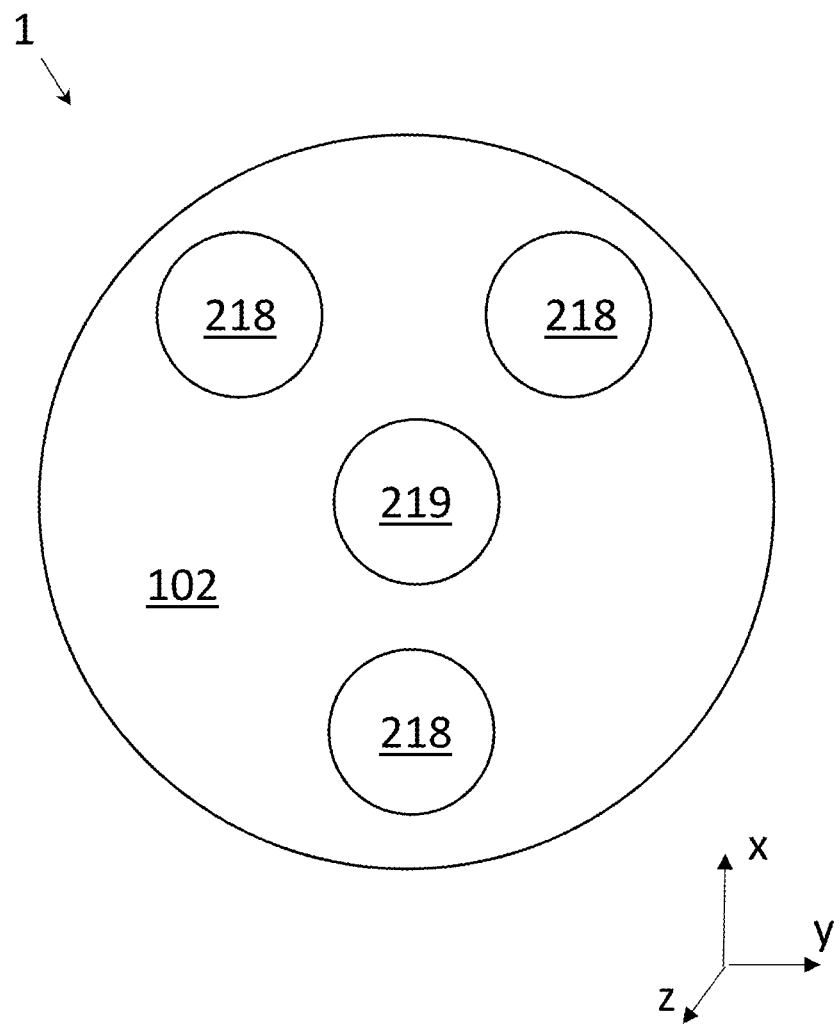
FIG. 3 shows a schematic top-down view of an STMG device having a circular arrangement.

Referring to the prior art STMG device having a specific cross-shaped layout as shown in FIG. 1 and FIG. 2, it was found by the inventors that, under at least some circumstances, such device can only work below a critical size. This means that only below a critical size the operating conditions of the device were found to be fulfilled, e.g. such that a correct magnetization state could be read effectively. This critical size depends on the width a of the arms of the crossbar and the material parameters of the ferromagnetic layers, such as the effective anisotropy $K_{eff}$ and the exchange stiffness constant $A_{ex}$. By simulating the operating conditions for different cross-shaped layouts with different parameters, it was found that the width of the arm, a, should be smaller than $$0.825*\sqrt{\frac{A_{ex}}{K_{eff}}}$$

which is about equal to the width of the domain wall.

Figure 4A:
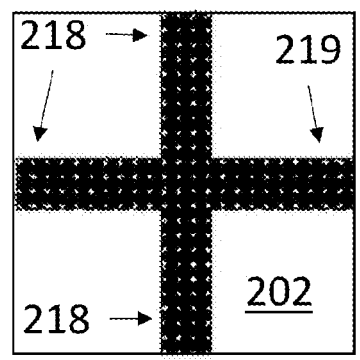
FIGS. 4A-4F show schematic representations of different magnetization states for a crossbar STMG device.
Figure 4B:
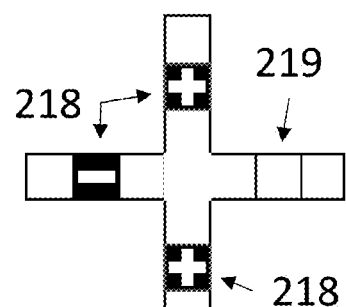
Figure 4C:
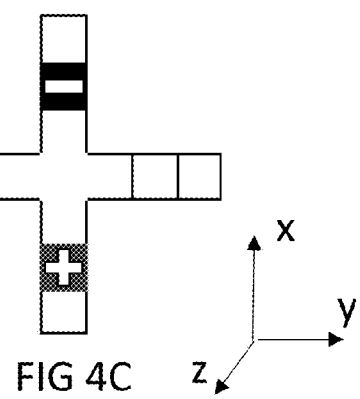
Figures 4D, 4E, 4F:
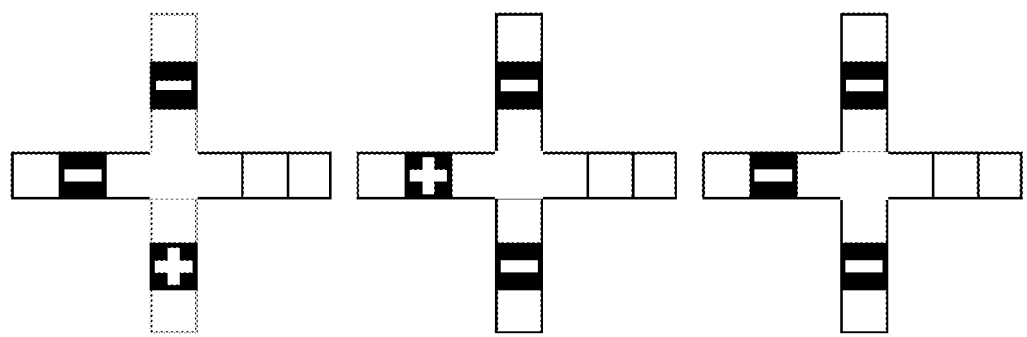

A more detailed explanation regarding these micromagnetic simulations for the crossbar layout is described hereinbelow in reference to FIGS. 4A-4F. For the simulations, the initial state of the crossbar STMG, e.g. as illustrated in FIG. 1, is chosen to be an "UP" state (with small, e.g. negligible, deviations possible) as shown in FIG. 4A. If at least two of the three inputs 218 induce an 'UP' magnetization state (for example by applying a positive voltage '+'), then the expected output magnetization should also be 'UP', and thus switching may not occur (FIGS. 4B, 4C). If however at least two of the three inputs 218 induce a 'DOWN' magnetization state (for example by applying a negative voltage '−'), then the expected output magnetization should become 'DOWN' and thus switching may occur (FIGS. 4D, 4E, 4F).

Figure 5A:
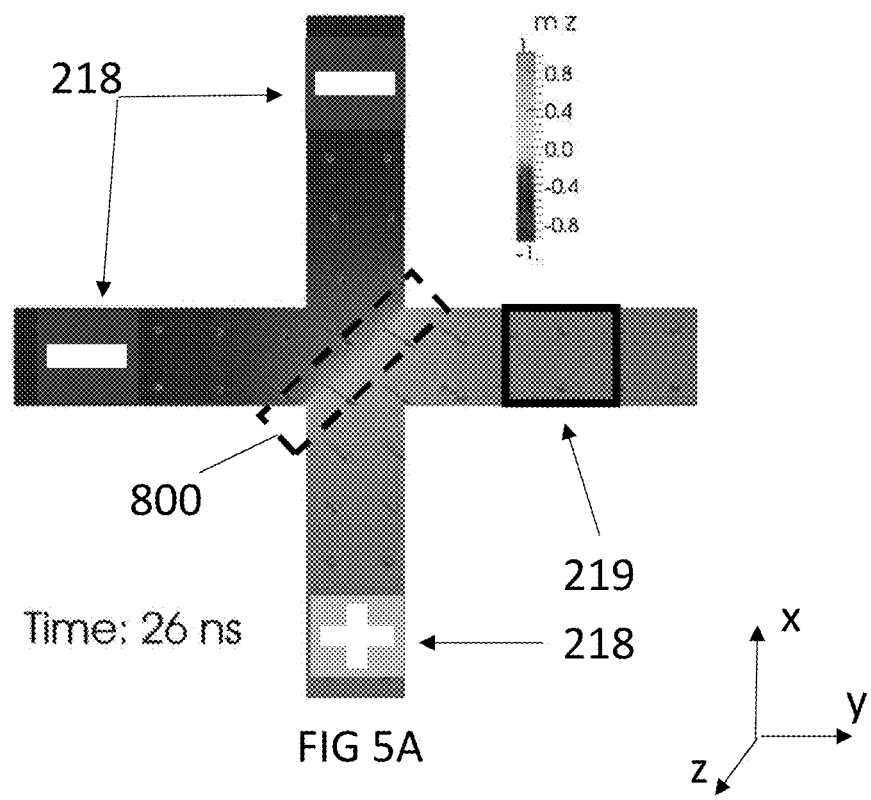
FIG. 5A shows a failure mode for a STMG having a crossbar arrangement.

One example of a main failure mode is shown in FIG. 5A for a crossbar layout having the following parameters: W=40 nm; $A_{ex}$=2e$^{-11}$ J/m; $K_{eff}$=110 kJ/m$^3$ and a pulse of 4 ns. Although two of the input pillars 218 have a negative ('−') magnetization, the output magnetization remains positive. It can be seen that in the center region 800 of the cross-shaped ferromagnetic layer, the domain wall can get stuck, such that it does not propagate further towards the output pillar 2019.

Based on these simulations it was found that the domain wall cannot cross the center of the crossbar layout under some circumstances, e.g., when its width is too small with respect to a, the width of the arm. More specifically, it was found by the inventors that, when $$a > 0.825\sqrt{\frac{A_{ex}}{K_{eff}}},$$

certain input combinations can fail to return the result expected. This failure mode is explained by the magnetic domain wall stopping at the center of the crossbar device, thus preventing the majority magnetic domain from propagating into the output zone. Conversely, under some other circumstances, e.g., when $$a < 0.825\sqrt{\frac{A_{ex}}{K_{eff}}},$$

the crossbar STMG can work for any input combination. These simulations suggest that, for realistic material parameters, very small devices with a critical dimension CD below 20 nm may need to be fabricated to avoid these failures in operation. However, fabricating such devices is very challenging with present technologies and small variations in device CD could result in large variations in device performance.

The energy barrier $E_b$ that separates the states 'UP' and 'DOWN' is about $4$ $at\sqrt{A_{ex}K_{eff}}$ (where t is the thickness of the free ferromagnetic layer). Since such prior-art devices may work when $$a < 0.825\sqrt{\frac{A_{ex}}{K_{eff}}}$$

under some circumstances, then $E_b < 3.3$ $tA_{ex}$. For realistic values of $A_{ex}$, and t, $E_b$ may be at most $21*kT$ (where k is the Boltzmann constant and, for example, the temperature is T=300K). The height of the barrier $E_b$ may be significant in determining the hold time of the state of the device. Since $E_b$ is only about 21 kT, the hold time may be about 1.3 seconds. While this may be long enough for logic operations, it is far lower than common holding times in memory devices, and is certainly not what is generally considered as "non-volatile," e.g. a holding time of seconds as compared to more than 10 years. Hence, a prior-art device having such crossbar layout cannot be used as a non-volatile logic device or non-volatile memory device. Moreover simulations have shown unpredictable failures, which could indicate an unreliable operation of such crossbar layout STMG device.

Figure 5B:
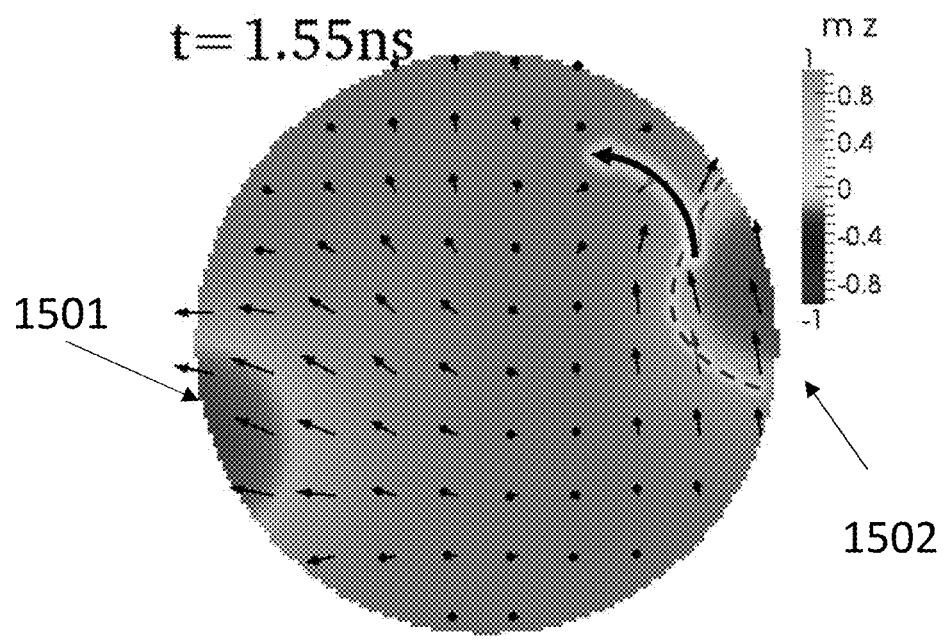
FIG. 5B shows a failure mode for a STMG having a circular arrangement.

Another example of a main failure mode is shown in FIG. 5B for a prior art device having a circular layout, corresponding to following parameters: W=40 nm; $A_{ex}$2e$^{-11}$ J/m; $K_{eff}$=110 kJ/m$^3$ and a pulse of 4 ns. In this example, the initial state is 'UP'; during the control pulse, the applied spin torques reverse the magnetization at the bottom left and the bottom right of the image, while it keeps the magnetization 'UP' at the top of the image. The magnetic domain nucleated at the bottom left moves slowly along the edge of the free layer. When it reaches the zone where the spin torque is 'UP' (at the top of the image), it is annihilated. As a consequence, at the end of the control pulse in which the spin torques are applied, the system is left with a small magnetic domain 1501 at the bottom left periphery and a small magnetic domain 1502 at the right side periphery, while the output area in the center remains in the 'UP' state, instead of the expected 'DOWN' state. To summarize, the motion of the magnetic domain along the edge has led to a failure. In a circularly shaped free ferromagnetic layer, there is no significant energy change when a magnetic domain moves along the edge of the circle. Therefore, a very small change in the initial conditions can result in either unexpected magnetization dynamics leading to a failure, such as illustrated by this example, or to the expected final magnetic state. This chaotic behavior may be prevented by a majority gate device according to embodiments of the disclosed technology. This can be understood, the invention not being limited by whether such simple and approximate reasoning offers a complete description of the complex physical phenomena involved, by the observation that a device according to embodiments of the invention may have substantially less symmetry, e.g. the degree of freedom of such symmetry may be limited to a 3N-fold rotational symmetry. Therefore, a preferred path of magnetization propagation directly connecting the controlled input regions, due to a very low or even substantially zero energetic cost, that could lead to the chaotic behavior as illustrated above, would not exist.

It was surprisingly found by the inventors that a layout having a 3N-fold rotational symmetry, with N being an integer larger than 0, according to embodiments of the disclosed technology may overcome the illustrated failure modes of the operation of both the prior art STMG device having a crossbar geometry and the prior art STMG device having a circular geometry, as described hereinabove. Therefore, by using a 3N-fold rotational symmetry a proper reliability of the propagation of the domain wall(s) can be advantageously ensured.

FIGS. 6A-6E illustrate example layouts for an STMG device according to embodiments of the present disclosure, which correspond to a majority gate device having 3N input zones, where, e.g., N=1 for illustrative purposes. That is, each layout of FIGS. 6A-6E comprises three input zones 121, 122, 123 arranged around and in contact with an output zone 124. Thus for the exemplary 3-fold rotational symmetry, the output zone 124 may have 3 sides and each of the input zones 121,122,123 may be in contact with a side of the output zone. The input zones 121, 122, 123 are separated from one another but in contact with the output zone 124 by a triangle-shaped boundary. The input zones are spaced apart from one another by the output zone, e.g. neighboring input zones may touch with one another only at one point of the output zone, e.g. in a negligible contact zone, or may be separated by a small distance from one another. Such distance separating neighboring input zones, at the edge forming the connection with the output zone, should preferably be smaller than the width of the domain wall formed between the input zone and the output zone, e.g. to allow good interaction of the magnetic states propagating from these input zones toward and into the output zone. Each input zone is coupled to at least one input control 118. The output zone is coupled to at least one output sensor 119. FIG. 6A and FIG. 6B are referred to herein as a 'circle segment' layout, as the input zones have the shape of a segment of a circle; FIG. 6C and FIG. 6E are referred to herein as a 'triangle' layout, as the input zones have the shape of a triangle; FIG. 6D is referred to herein as a 'square' layout, as the input zones have the shape of a square. The segment for a 'segment' layout may be a minor segment (corresponding to an arc of a circle having a central angle less than 180 degrees, as depicted in FIG. 6A) or a major segment (corresponding to an arc of a circle having a central angle greater than 180 degrees, as depicted in FIG. 6B). The shape of the input zone for a 'segment' layout may also be a semicircle (corresponding to an arc of a circle having a central angle of about 180 degrees), which is a special case of a segment.

Each input zone and the output zone corresponds to a magnetic domain of the free ferromagnetic material, where each magnetic domain has a magnetization state. If two or three input zones have an UP magnetization, then the magnetization of the magnetic domain corresponding to the output zone is also an UP magnetization, which is equal to the majority magnetization of the three input zones, in accordance with the expected operation of a majority gate device. If two or three input zones have a DOWN magnetization, then the magnetization of the magnetic domain corresponding to the output zone is also DOWN, which is equal to the majority magnetization of the three input zones.

The different features of the majority gate device according to embodiments of the disclosed technology will now be explained by way of the 'square' layout, shown in FIG. 7. The majority gate device 2 comprises a free ferromagnetic layer 112, e.g. provided on a substrate. The free ferromagnetic layer 112 may have a shape which has 3N-fold rotational symmetry, e.g. 3-fold rotational symmetry for N=1. The free ferromagnetic layer 112 comprises three input zones 121, 122, 123 and one polygon shaped output zone 124, e.g. a triangular output zone. The output zone may have the shape of a regular polygon, e.g. an equilateral triangle.

The output zone has a boundary 130 consisting of 3N boundary line segments 131, 132, 133, e.g. three boundary lines, with each input zone 121, 122, 123. These four zones 121, 122, 123, 124 may have a non-zero magnetization which may be directed out-of-plane at equilibrium. The magnetization of each input zone 121, 122, 123 can be controlled by at least one input control 1181, 1182, 1183 (e.g. by use of spin transfer torque (STT)) such that it can be switched to the desired 'UP' or 'DOWN' state, which may correspond respectively to the logic states '0' and '1'. The magnetization of the output zone 124 may be read by an output sensor 119. The output sensor functions thus as a read-out device. The input controls 1181, 1182, and 1183 are magnetically coupled to input zones 121, 122 and 123, respectively. The output sensor 119 is also magnetically coupled to the output zone 124.

The input zones 121, 122, 123 (and as a consequence also the input controls 1181, 1182, 1183) may be located along three axes 151, 152, 152, respectively, for the exemplary 3-fold geometry, forming three angles α1, α2, α3 each substantially equal to 120 degrees, e.g. 120 degrees or about/close to 120 degrees, for example in the range of 115 to 125 degrees. The input zones 121, 122, 123 may thus be located according to a 3-fold rotational symmetry. The output zone 124 (and as a consequence also the output sensor 119) may preferentially be centered at the intersection of these three axes 151, 152, 152. The output zone 124 may be slightly off-centered, e.g. not more than 50 nm, preferably not more than 20 nm, from the intersection of the three axes 151, 152, 152.

Figure 7:
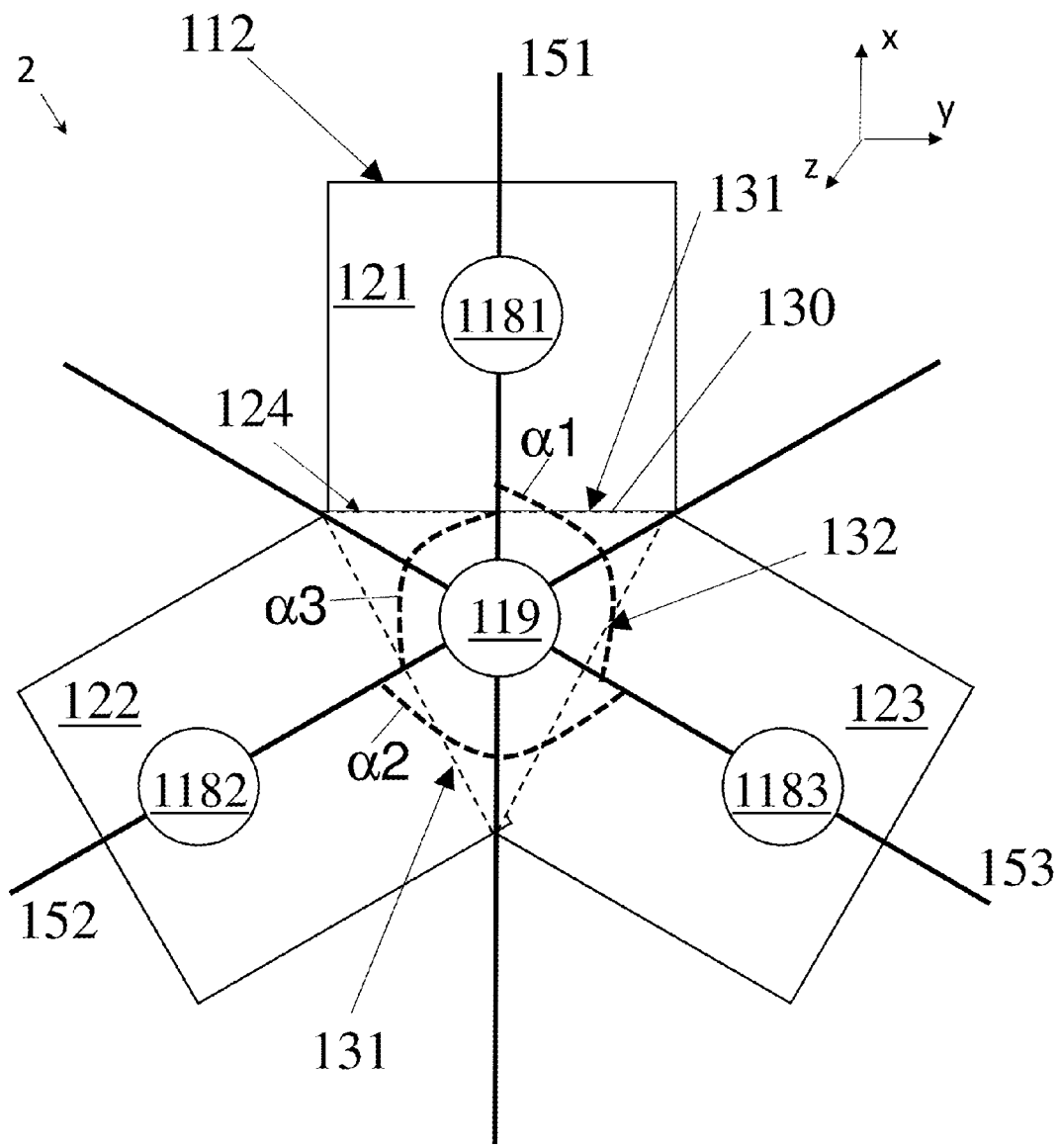
FIG. 7 shows a schematic top view of a 'square' layout for a STMG device according to embodiments of the disclosed technology.

In various embodiments, neighboring input zones 121, 122, 123 may intersect each other respectively at one point thereby forming a triangular boundary 130 with the output zone as shown in FIG. 7. However, embodiments are not so limited, and the neighboring input zones 121, 122, 123 do not need to touch, but may be separated at a certain distance 200 from one another. The neighboring intersection points of the input zones with the output zone may be at a distance 200 from one another which may be typically smaller than the width of the domain wall. An example is shown in FIG. 8, which shows simulations representing the spontaneous evolution of the magnetization (and the domain walls 181, 182). A 3N-polygonal body, e.g. a triangular boundary, between the input zones and the output zone may be preferred, because in this case the domain walls between the input zones and the output zone are merging at the intersection point between neighboring input zones. The intersection points may thus form the vertices of the polygonal output zone, e.g. the triangular output zone. Also when a distance 200 is present between the neighboring input zones 121, 122, 123 (but the distance 200 being smaller than the width of the domain wall), the domain walls 181, 182 may/can merge and propagate through the output zone, the domain wall 183 ending in its minimum energy, just as in the triangular case without a short distance 200 separating the input zones at the boundary with the output zone.

The output zone may have a polygonal shape according to some embodiments, e.g. a triangular shape for a 3-fold rotational symmetry, and thus a polygonal, e.g. a triangular, boundary with the neighboring input zones. The cross section may be narrowed at the contact area between the output zone and each input zone. According to some other embodiments, the output zone may have a regular polygonal shape, e.g. an equilateral triangular shape, in which the sides or boundary lines are substantially equally dimensioned. As a consequence, each vertex of the equilateral triangular output zone is in contact with two input zones.

The working principle and related advantages of the present disclosure will now be explained by means of the 'square' layout in FIG. 10. The different features of the layout are identical to the ones shown in the 'square' layout in FIG. 7. A person skilled in the art can easily use this working principle for other shapes and variations in accordance with embodiments of the disclosed technology. However, such working principle are only provide to aid in understanding embodiments of the invention and reducing the invention to practice, and are not to be considered as limiting the invention in any way.

Figures 10A, 10B, 10C:
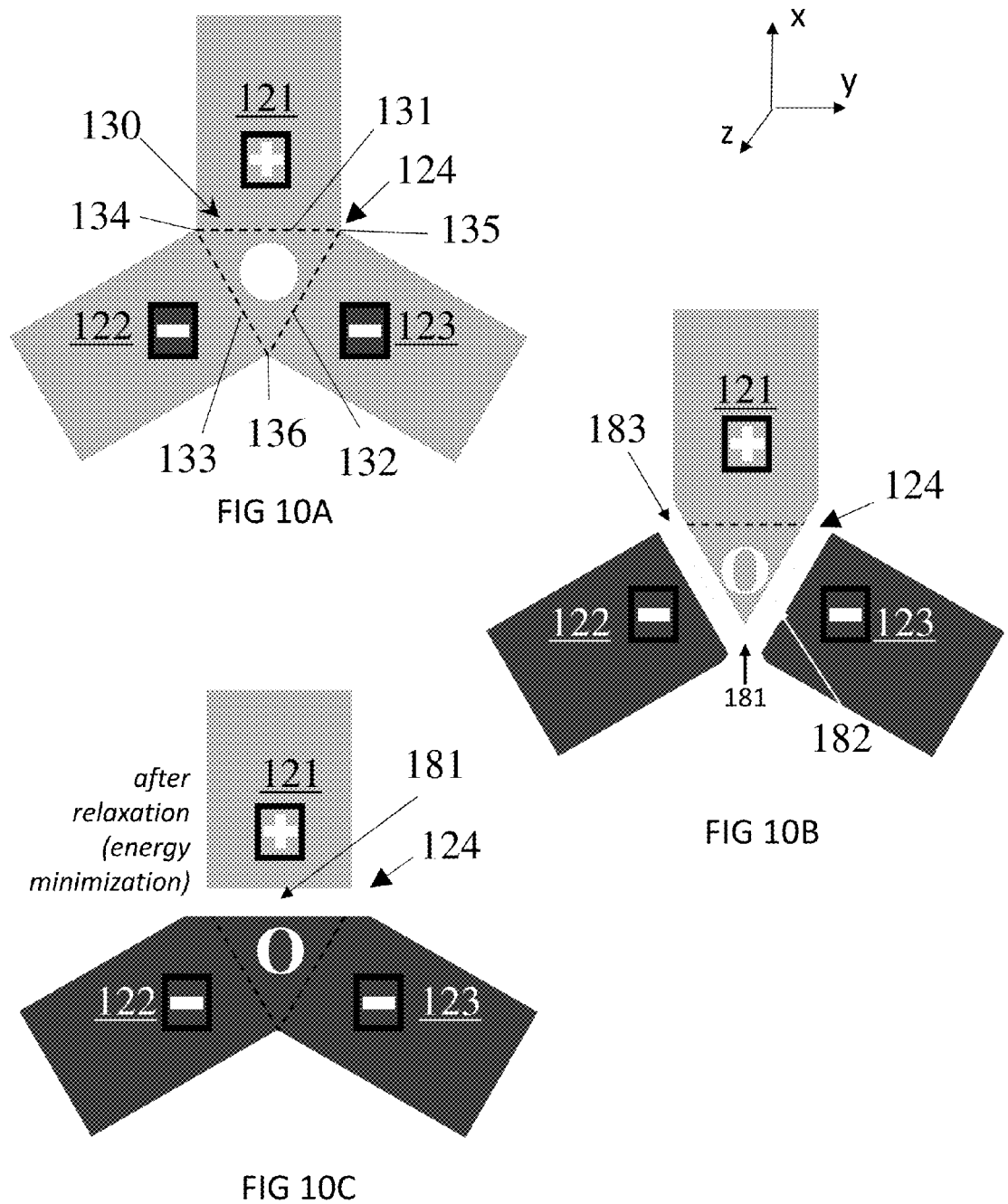
FIGS. 10A-10C show results of simulations performed for a STMG device having a 'square' layout, according to embodiments of the disclosed technology.

FIG. 10A shows simulation results for the device in an initial state with the magnetization being 'UP' for one (first 121) input zone and being 'DOWN' for the two remaining (second 122 and third 123) input zone. This means the majority magnetization is 'DOWN' The output zone 124 is centered relative to the tree input zones 121, 122, 123. A triangular boundary zone 130 (shown with dashed line) may be defined as the boundary region between the input zones 121, 122, 123 and the output zone 124. The triangular boundary zone 130 consists of three boundary line segments 131, 132, 133 and three corner points 134, 135, 136.

FIG. 10B shows simulations for the device during a pulse applied to the input controls, or directly after the pulse. Domain walls 182,183 are formed at the boundary lines 132 and 133, however at the intersection point 136 between the two boundary lines, the domain walls 182, 183, join to form one large, angulated domain wall 181 which is however unstable and will try to propagate further towards its minimal energy resulting in FIG. 10C. FIG. 10C illustrates simulation results of the magnetic situation after relaxation of the device (which means no pulse is applied to the input controls). In FIG. 10C, the domain wall has thus propagated through the output zone 124 and reached its optimal energy at the boundary line 131. This results in the magnetization of the output zone 124 being switched from the initial 'UP' state to the final 'DOWN' state which is the majority state.

Figure 11A:
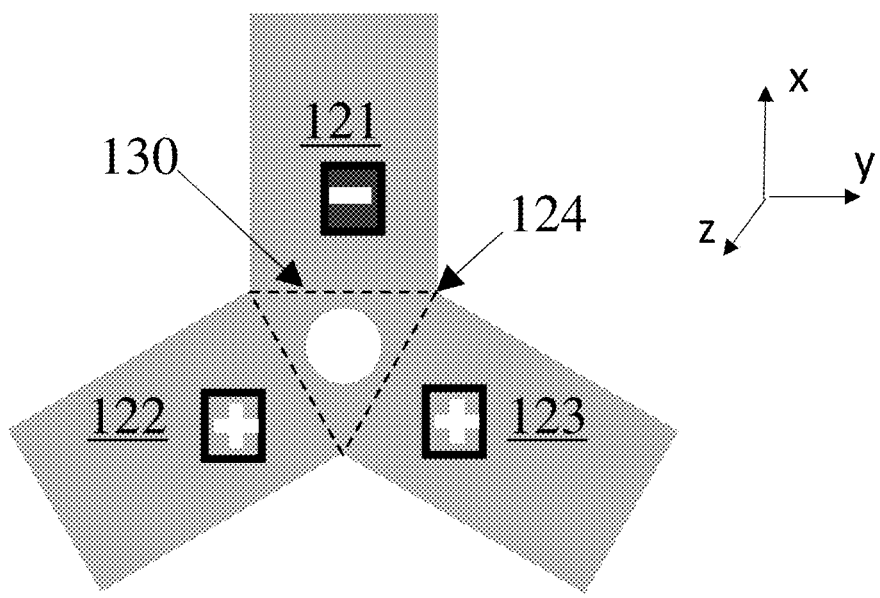
FIGS. 11A and 11B show results of simulations performed for a STMG device having a 'square' layout, according to embodiments of the disclosed technology.
Figure 11B:
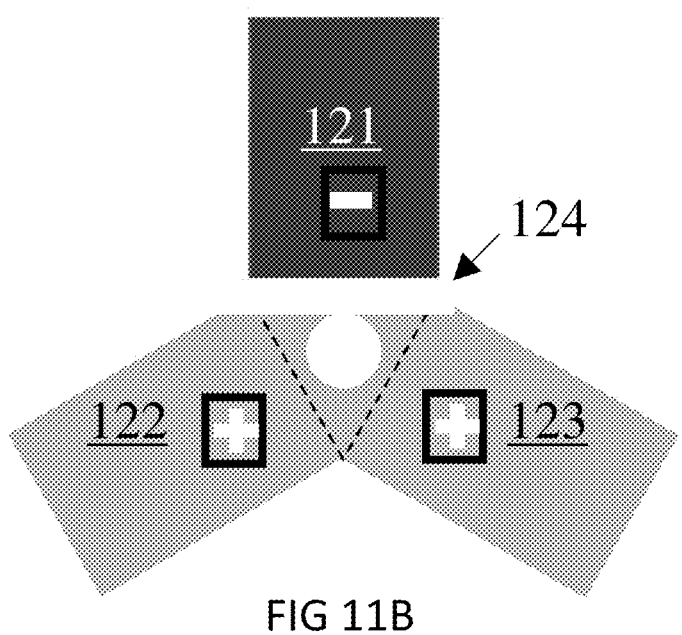

An analogue explanation may be done for a majority gate device with an initial state wherein the magnetization is 'UP' for two (second 122 and third 123) input zones and is 'DOWN' for the remaining (first 121) input zone, as shown in FIG. 11A. The majority magnetization of the input zones is thus 'UP'. After relaxation of the device, as shown in FIG. 11B, the domain wall remains between the first input zone 121 and the output zone 124 such that the magnetization of the output zone is 'UP', which is equal to the majority magnetization of the input zones. The domain wall does not propagate through the output zone.

In both exemplary cases, the reliable behavior may be ensured by energy minimization. The energy of a domain wall is proportional to its surface, and therefore to its length. In the case of the reversal of two inputs, as shown in FIGS. 10A-10C, the two domain walls merge at one point, near a vertex of the equilateral triangle, forming thus one long domain wall. Due to energy minimization, the domain wall length is minimized, leading to spontaneous propagation across the output zone. Therefore, the output zone is switched to the expected 'DOWN' majority state. In the case of the reversal of one input, as shown in FIGS. 11A and 11B, the domain wall will not propagate through the output zone because this would increase the energy. Therefore, the output zone stays in the majority 'UP' state.

In the first case of reversal of two input zones (FIGS. 10A-10C), the correct operation is ensured by merging of the two domain walls. This merging is easily understood when the output is triangular, because the two inputs intersect at one point. However, it can also work when they are not in contact, but are instead separated by a distance typically smaller than the width of the domain wall as explained in FIGS. 8A and 8B.

According to embodiments of the disclosed technology, each input zone may be further divided into more subzones, such as two, three, four or more subzones, each subzone being magnetically coupled to an input control. The input controls of neighboring subzones are connected to one another in order to form one joint input control for the input zone. FIGS. 12A-12D show an alternative shape for the majority gate device according to embodiments of the present disclosure, where the device comprises two subzones for each input zone. On each subzone an input control is provided for controlling the magnetization state of the free ferromagnetic layer. This layout has the advantage that more relaxed dimensions can be used which are more compatible with current patterning techniques.

Figure 13:
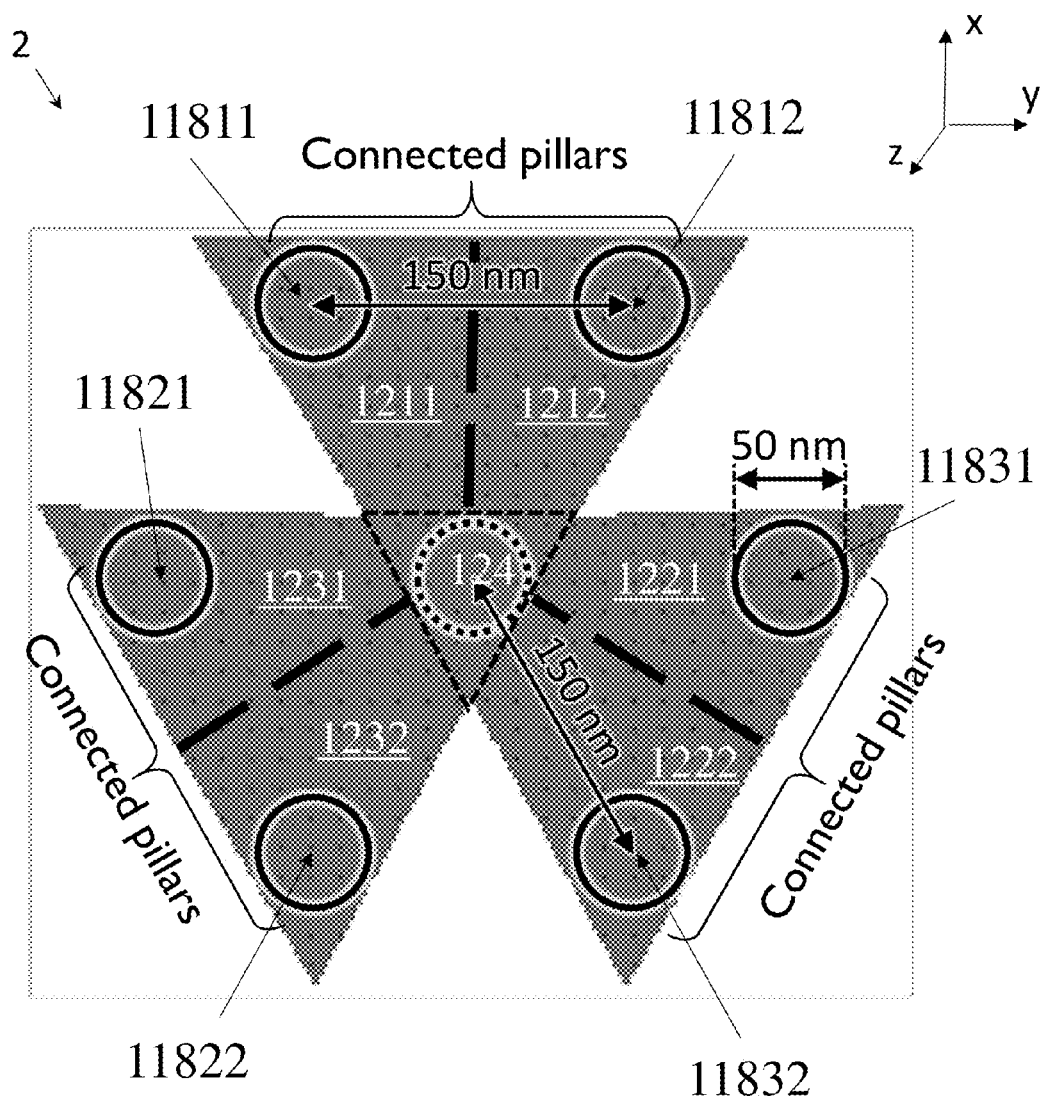
FIG. 13 shows a schematic top view of a STMG device comprising subzones, according to embodiments of the present disclosure.

For the exemplary layouts as shown in FIGS. 6A-6E, the spacing or distance between the output sensor and each input control should preferably be smaller than about 60 nm and the spacing or distance between the input controls mutually should preferably be smaller than about 100 nm. This may put a burden on the patterning of such majority gate device. Therefore an alternative majority gate device according to embodiments of the disclosed technology is illustrated in FIG. 13. The majority gate device has a different shape which compared to the shapes as shown in FIGS. 6A-6E in that the edge of the input zone at the largest distance from the output zone is broader than the length of the boundary line in between the input zone and the output zone. For the shapes proposed in FIGS. 6A-6E the edge of the input zone at the largest distance from the output zone is equal or smaller than the length of the boundary line in between the input zone and the output zone. In case, for example, of the triangle shape (FIG. 6C, FIG. 6E), the edge of the input zone at the largest distance from the output zone is zero as these shape end with a vertex. Otherwise said, the width of the input zone is thus decreasing towards the output zone. In case, for example, of the square layout (FIGS. 6C-6D), the edge of the input zone at the largest distance from the output zone is equal to the length of the boundary line in between the input zone and the output zone. The input zone may be coupled to only one input control, but—as shown in FIG. 13—subzones may be advantageously defined, each being coupled to an input control. Each input control 11811, 11812, 11821, 11822, 11831, 11832 respectively associated with each subzone 1211, 1212, 1221, 1222, 1231, 1232 of the input zone 121, 122, 123 is connected to one other, e.g. the controls 11811,11812 of the input zone 121 (divided in subzones 1211 and 1212) may be connected, the controls 11821,11822 of the input zone 123 (divided in subzones 1231,1232) may be connected and the controls 11832,11831 of the input zone 122 (divided in subzones 1221,1222) may be connected.

The majority gate device according to the present disclosure allows thus a great flexibility of the shape, as long as the device comprises the 3N-fold rotational symmetry.

One way to control the magnetization in the input zones is inducing a spin torque. This can be performed using a magnetic tunnel junction (MTJ), for example. In that case, the input control may comprise a tunnel barrier layer and a fixed ferromagnetic layer on top of the free ferromagnetic layer, with current flowing perpendicularly to the plane of the free ferromagnetic layer. Similarly, the output magnetization can also be sensed by a magnetic tunnel junction (MTJ). In that case, the output sensor may also comprise a tunnel barrier layer and a fixed ferromagnetic layer on top of the free ferromagnetic layer. The output magnetization would be then sensed by the tunnel magneto-resistance effect (TMR). As a consequence, three input controls (or pillars) and one output sensor (or pillar) would be put on top of the free ferromagnetic layer. These pillars do not need to be as big as the input (or output) zones and may have a smaller contact surface with the free ferromagnetic layer.

Figure 14A:
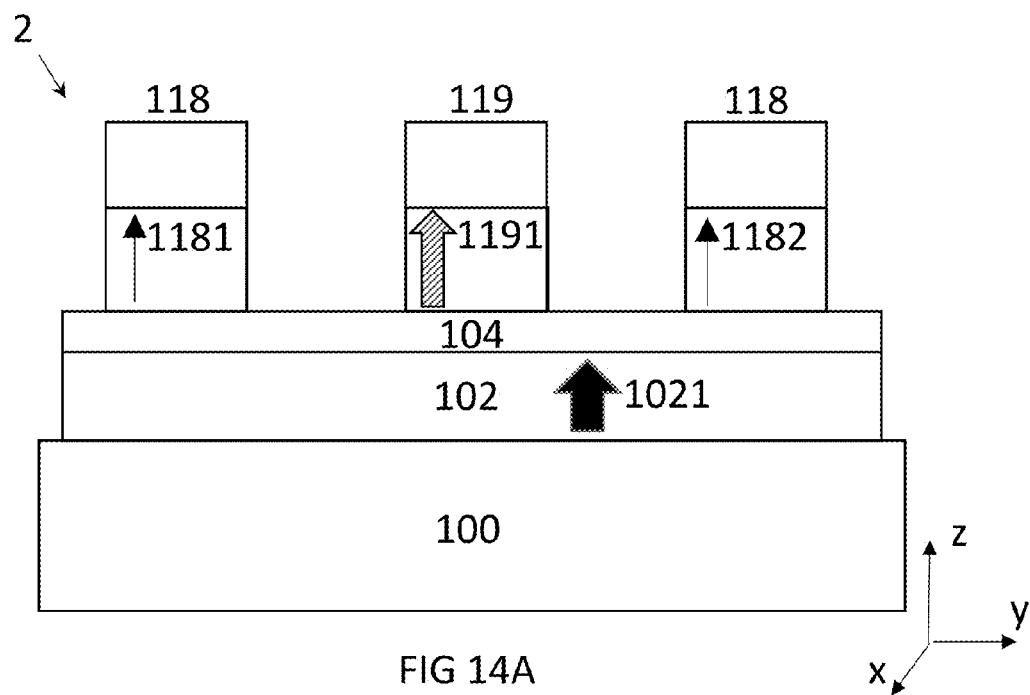
FIGS. 14A and 14B show schematic side views of a STMG device according to embodiments of the present disclosure.
Figure 14B:
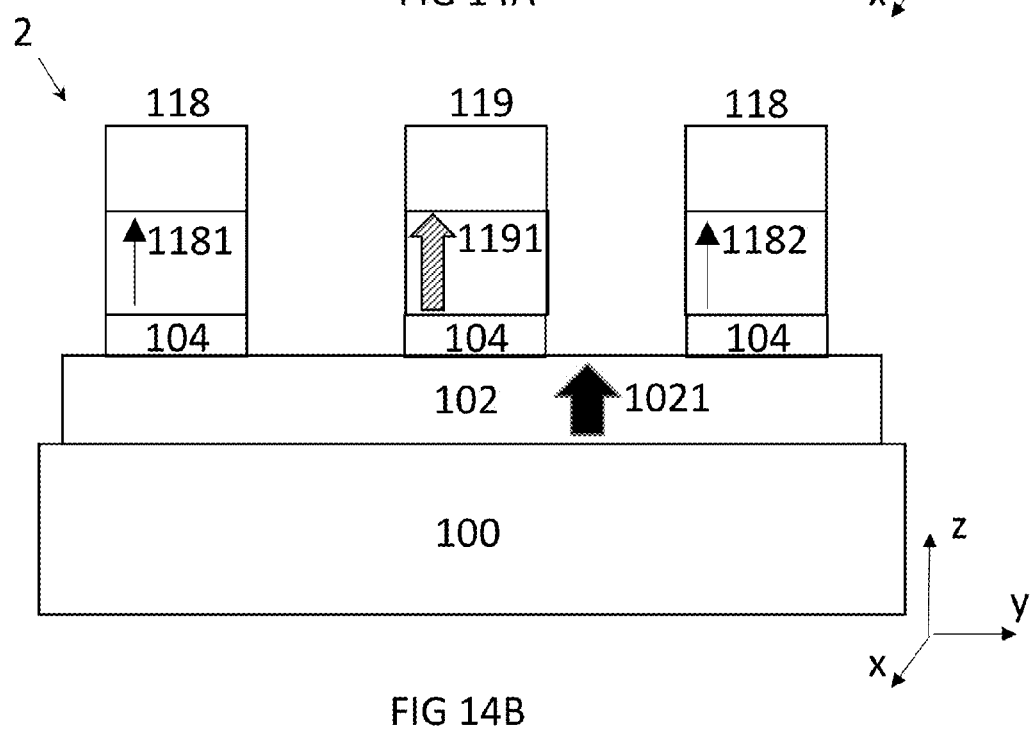

FIG. 14A and FIG. 14B show a schematic side view of a majority gate device according to embodiments of the present disclosure. Due to the 3N-rotational symmetry, only two of the three input controls are visible from the side view. A tunnel barrier layer or non-magnetic layer 104 may be formed on and over the whole surface of the free ferromagnetic layer (FIG. 14A) or may be formed as bottom layer of the input and/or output sensor/pillars (FIG. 14B). According to embodiments, the input controls may further comprise a fixed ferromagnetic layer atop the non-magnetic layer having a controllable magnetization state 1181, 1182 (in the example shown being 'UP'). The majority magnetization 1021 of the free ferromagnetic layer 102, in this example, is thus 'UP' and therefore the output sensor will read out a magnetization state 1191 being 'UP'.

Control of the magnetization in the input zones of the free ferromagnetic layer could also be done or assisted by other means, such as in-plane current, spin Hall effect, giant spin Hall effect, Rashba torque, spin-orbit torque, magnetic field generated by a current, magnetic field generated by additional ferromagnetic layers (stray field), voltage-controlled anisotropy (electric field), etc.

Sensing of the magnetization at the output sensor could also be done by other means such as a magnetic read head, etc.

The device could also be working when it is so small that it behaves as a macro-spin, i.e. when the ratio of the device size over the domain wall width is smaller than a certain value. In that case, the output magnetization is quickly going into the expected state thanks to the exchange interaction.

A three dimensional stack 3 could also be manufactured which cascades several level of majority gates according to embodiments of the disclosed technology on top of each other. Such three dimensional majority gate device may comprise a first layer 31 and a second layer 32 stacked on the first layer 31. The first layer 31 may comprise majority gate devices 2 according to embodiments and the second layer 32 may comprise majority gate devices 2 according to embodiments. The output zone of each majority gate device of the first layer 31 may be coupled to a corresponding input zone 2121 of a majority gate device of the second layer 32. This may be extended to a further layer, e.g. a third layer 33, and yet further to additional layers. For example, three layers 31, 32, 33 are schematically shown in a stacked arrangement according to embodiments in FIG. 11D, while a first layer 31, a second layer 32 and a third layer 33 are illustrated respectively in FIGS. 11A-11C.

This kind of stacking is possible due to the advantageously large range of working sizes in accordance with embodiments of the disclosed technology. The magnetization state of the output zone 1124 of a first level, corresponding to first level input zones 1121, 1122, 1123, may be directly transmitted to a second level input zone 2121. Likewise, the magnetization state of the output zone 2124 of the second level may be directly transmitted to a third level input zone 3121. Therefore, the magnetization state of the first level input zones may propagate to higher levels, e.g. corresponding to stack layers thereabove, as shown in FIG. 11A (1st level), FIG. 11B (2nd level) and FIG. 11C (3rd level). It shall be clear that the number of levels can thus be even further extended to accommodate a large number of inputs, e.g. exponentially growing as function of the number of stack layers. The transmission of output to input states between levels may for example be done by exchange magnetic coupling, by interlayer exchange coupling via a trilayer system or a multilayer system (the Ruderman-Kittel-Kasuya-Yosida (RKKY) coupling could for example be a possible interlayer exchange coupling). The coupling may also be provided by conversion into an electric signal and reconversion into a magnetic state. The transmitted magnetic state could also be the opposite (DOWN for UP and UP for DOWN), e.g. the input state of a next layer could be provided as the inverse state of the output state of a previous level. In that case, a NOT gate may be implemented between these two levels. For more control over this magnetic logic circuit, a kind of 'magnetic switch' may also be provided, that would transmit the information to the upper level (i.e. to the input) or would not transmit it, or would transmit the opposite state, depending on the state of such switch.

The majority gate device according to present disclosure comprises a free ferromagnetic layer which comprises a ferromagnetic material such as for example CoFe alloy, NiFe alloy, PtFe alloy, CoFeB alloy.

The majority gate device according to present disclosure may comprise a non-magnetic tunnel barrier layer. For a magnetic tunnel junction (MTJ) stack, the tunneling barrier layer may comprise an oxide selected from the group consisting of magnesium oxide, magnesium-titanium oxide, magnesium-aluminium oxide or aluminium oxide. For a giant magneto resistor (GMR) stack, the tunneling barrier layer comprises a non-magnetic metallic material chosen from Cu, Cr or Ru.

With all the majority gates at the same level the output state (e.g. via an MTJ) can be detected and the corresponding signal can then be injected into a new input (e.g. via MTJ). This is thus a conversion of magnetic to electrical signal and vice versa. This may be done with or without amplification of the spin-polarized current. Another possibility is use of a magnetic strip that would serve as a bridge between the output zone and the new input zone.

In a further aspect, the disclosed technology also relates to a method for operating a majority gate device according to embodiments of the first aspect of the disclosed technology. This method comprises applying a predetermined voltage to each input control of the majority gate device, e.g. applying to each input control a corresponding input voltage; and thereafter, determining the combined effect of the predetermined voltages on the magnetization state of the output zone, e.g. using the output sensor of the device. In a method according to embodiments, the magnetization state of the output zone of the device may equal the majority magnetization state of the input zones. For example, determining the combined effect of the predetermined voltages on the magnetization state of the output zone may comprise determining the magnetization state of the output zone, said magnetization state of the output zone being equal to the majority magnetization state of the input zones. In a method for operating a majority gate device in accordance with embodiments of the disclosed technology, the combined effect of the predetermined voltages may induce the adjoining of at least two domain walls and the propagation of the adjoined domain walls entirely through the output zone. In a method according to embodiments of the disclosed technology, the magnetization state of the input zones may be controlled by in-plane current, spin Hall effect, giant spin Hall effect, Rashba torque, spin-orbit torque, magnetic field generated by a current, magnetic field generated by additional ferromagnetic layers (stray field) or voltage-controlled anisotropy (electric field).

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words above using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments of the inventions have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A majority gate device, comprising:
a free ferromagnetic layer comprising 3N input zones and an output zone, wherein the output zone has a polygon shape having 3N sides, wherein each of the input zones adjoins the output zone at a corresponding side of the polygon shape and the input zones are positioned around the output zone according to a 3N-fold rotational symmetry, wherein N is a positive integer, and wherein the input zones are spaced apart from one another by the output zone;
a plurality of input controls, wherein each of the input controls is magnetically coupled to a corresponding one of the input zones, and wherein each of the input controls is adapted for controlling the magnetization state of the corresponding one of the input zones; and an output sensor magnetically coupled to the output zone, the output sensor being adapted for sensing the magnetization state of the output zone.

2. The majority gate device according to claim 1, wherein the output zone and each of the input zones of the free ferromagnetic material correspond to a magnetic domain, each magnetic domain having a substantially uniform magnetization state when in equilibrium.

3. The majority gate device according to claim 1, wherein each of the input controls is magnetically coupled to the corresponding one of the input zones by a magnetic tunnel junction.

4. The majority gate device according to claim 1, wherein the output sensor is magnetically coupled to the output zone by a magnetic tunnel junction.

5. The majority gate device according to claim 1, wherein each of the input controls and/or the output sensor has a circular pillar shape.

6. The majority gate device according to claim 1, wherein distances between each of the input controls and the output sensor are shorter than 400 nm.

7. The majority gate device according to claim 1, wherein distances between the output sensor and each of the input controls are substantially equal.

8. The majority gate device according to claim 1, wherein each of the input zones is subdivided into neighboring input subzones, wherein the corresponding ones of the input controls of the input zones are magnetically coupled to one of the input subzones, and wherein the majority gate device further comprises, for a remaining one of the input subzones another corresponding input control, the another input control being magnetically coupled to a corresponding input subzone, and wherein the input controls of each input zone are electrically connected to each other.

9. The majority gate device according to claim 1, wherein each of the input zones has a shape corresponding to one of the following: an isosceles trapezoid, a rectangle, a square, a triangle, a circular segment and a semicircle.

10. The majority gate device according to claim 1, wherein the width of each input zone decreases towards the output zone.

11. A three dimensional majority gate device comprising a first layer and a second layer stacked on the first layer, the first layer comprising one or more majority gate devices according to claim 1 and the second layer comprising one or more majority gate devices according to claim 1, wherein the output zone of each of the one or more majority gate device of the first layer is coupled to a corresponding input zone of a majority gate device of the second layer.

12. A method of operating the majority gate device according to claim 1, comprising:

applying a predetermined voltage to each of the input controls; and thereafter, determining a combined effect of the predetermined voltages on the magnetization state of the output zone.

13. The method of operating the majority gate device according to claim 12, wherein the magnetization state of the output zone equals a majority of magnetization states of the input zones.

14. The method of operating the majority gate device according to claim 12, wherein the combined effect of the predetermined voltages induces adjoining of at least two domain walls and propagation of the adjoined domain walls entirely through the output zone.

15. The method of operating the majority gate device according to claim 12, wherein the magnetization state of each of the input zones is controlled by one of the following: in-plane current, spin Hall effect, giant spin Hall effect, Rashba torque, spin-orbit torque, magnetic field generated by a current, magnetic field generated by additional ferromagnetic layers and voltage-controlled anisotropy.

* * * * *